(12) United States Patent
Yano et al.

(10) Patent No.: US 12,317,435 B2
(45) Date of Patent: May 27, 2025

(54) VENTILATION STRUCTURE

(71) Applicant: NITTO DENKO CORPORATION, Ibaraki (JP)

(72) Inventors: Youzou Yano, Osaka (JP); Takumi Takahashi, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 360 days.

(21) Appl. No.: 17/633,357

(22) PCT Filed: Aug. 7, 2020

(86) PCT No.: PCT/JP2020/030458
§ 371 (c)(1),
(2) Date: Feb. 7, 2022

(87) PCT Pub. No.: WO2021/029386
PCT Pub. Date: Feb. 18, 2021

(65) Prior Publication Data
US 2022/0287191 A1    Sep. 8, 2022

(30) Foreign Application Priority Data

Aug. 9, 2019  (JP) .................................. 2019-147636
Oct. 31, 2019 (JP) .................................. 2019-198984

(51) Int. Cl.
*H05K 5/02* (2006.01)
*H05K 5/03* (2006.01)
*H05K 5/06* (2006.01)

(52) U.S. Cl.
CPC ......... *H05K 5/0213* (2013.01); *H05K 5/0216* (2022.08); *H05K 5/03* (2013.01); *H05K 5/068* (2013.01)

(58) Field of Classification Search
CPC ...... H05K 5/0213; H05K 5/0216; H05K 5/03; H05K 5/068
(Continued)

(56) References Cited

U.S. PATENT DOCUMENTS

| | | |
|---|---|---|
| 2003/0220067 A1 | 11/2003 | Mashiko et al. |
| 2007/0109730 A1 | 5/2007 | Shigyo et al. |
| 2013/0055898 A1* | 3/2013 | Yano ..................... H05K 5/0216 96/4 |

FOREIGN PATENT DOCUMENTS

| | | |
|---|---|---|
| CN | 1505739 A | 6/2004 |
| CN | 208452799 U | 2/2019 |

(Continued)

OTHER PUBLICATIONS

First Office Action issued for Chinese Patent Application No. 202080053236.5, dated Sep. 13, 2023, 16 pages including English machine translation.
(Continued)

*Primary Examiner* — Allen R. B. Schult
(74) *Attorney, Agent, or Firm* — HSML P.C.

(57) ABSTRACT

A ventilation structure (1*a*) includes a housing (10*a*) and a ventilation component (20*a*). The housing (10*a*) has a first surface (12) defining a lateral surface of a columnar space (11*c*) in an attachment hole (11). The ventilation component (20*a*) is attached to the housing (10*a*) to close the attachment hole (11). The ventilation component (20*a*) has a ventilation path (21) between an inner space (15*u*) of the housing (10*a*) and an outer space (15*s*) of the housing (10*a*). The ventilation component (20*a*) includes a supporting portion (23), a gas-permeable membrane (22), a protruding portion (24), and a sealing member (25). The supporting portion (23) surrounds the ventilation path (21) in plan view. The protruding portion (24) protrudes from the supporting portion (23) toward the inner space (15*u*) of the housing (10*a*), and
(Continued)

is inserted into the attachment hole (11). The sealing member (25) is disposed on an outer periphery of the protruding portion (24), and seals a gap between the first surface (12) and the protruding portion (24).

17 Claims, 6 Drawing Sheets

(58) Field of Classification Search
USPC .......................................................... 454/339
See application file for complete search history.

(56) References Cited

FOREIGN PATENT DOCUMENTS

| JP | 2004047425 | | 2/2004 | | |
|---|---|---|---|---|---|
| JP | 2007141959 | | 6/2007 | | |
| JP | 2011052791 | | 3/2011 | | |
| JP | 2014233156 | | 12/2014 | | |
| JP | 2018082090 | | 5/2018 | | |
| JP | 2018082090 | A * | 5/2018 | ............. | H02G 3/088 |
| JP | 2018148089 | | 9/2018 | | |
| WO | 03040575 | A1 | 5/2003 | | |
| WO | 2013024060 | | 2/2013 | | |

OTHER PUBLICATIONS

International Search Report and Written Opinion issued for International Patent Application No. PCT/JP2020/030458, Date of mailing: Oct. 20, 2020, 17 pages including English translation.

Notice of Reasons for Refusal issued for Japanese Patent Application No. 2021-539283, Dispatch Date: Jun. 11, 2024, 7 pages including English machine translation.

Office Action issued for Korean Patent Application No. 10-2022-7007396, dispatch date of Apr. 29, 2024, 18 pages including English machine translation.

Decision of Rejection issued for Chinese Patent Application No. 202080053236.5, dated Jul. 27, 2024, 21 pages including English machine translation.

Office Action issued for Korean Patent Application No. 10-2022-7007396, Dispatched date: Jan. 28, 2025, 22 pages including English machine translation.

* cited by examiner

VENTILATION STRUCTURE

TECHNICAL FIELD

The present invention relates to a ventilation structure.

BACKGROUND ART

Conventionally, there have been known ventilation structures in which a ventilation component is attached to a housing having an opening.

For example, Patent Literature 1 describes a ventilation structure including a housing having an opening portion for ventilation and a ventilation member attached to the opening portion. In the opening portion, a taper is defined in which an opening diameter increases in a direction from an inner space of the housing toward an outer space of the housing. The ventilation member includes a gas-permeable membrane, a support supporting the gas-permeable membrane, and a seal ring provided at the base of a leg portion of the support. The seal ring is deformed along the taper by being sandwiched between the support and the housing.

Meanwhile, Patent Literature 2 describes a ventilation housing in which a predetermined ventilation member is fixed to a housing. The ventilation member has a supporting portion and an insertion portion. The supporting portion supports a gas-permeable membrane. The insertion portion is inserted into an opening portion of the housing. The insertion portion is divided into a plurality of parts circumferentially. On a surface of the supporting portion facing the housing, a sealing portion such as an O-ring can be provided.

CITATION LIST

Patent Literature

Patent Literature 1: JP 2011-52791 A
Patent Literature 2: JP 2004-47425 A

SUMMARY OF INVENTION

Technical Problem

The techniques described in Patent Literatures 1 and 2 have room for reconsideration from the viewpoint of suppressing that the contact area for sealing in the seal ring or the sealing portion decreases due to a change in environmental conditions.

In view of this, the present invention provides a ventilation structure in which a sealing member has a contact area for sealing that is less likely to decrease due to a change in environmental conditions.

Solution to Problem

The present invention provides a ventilation structure including:
  a housing having an attachment hole and a first surface, the first surface: defining a lateral surface of a columnar space in the attachment hole; or defining a taper in the attachment hole in which a hole diameter decreases in a direction from an inner space of the housing toward an outer space of the housing; and
  a ventilation component attached to the housing to close the attachment hole, and having a ventilation path between the inner space of the housing and the outer space of the housing, wherein
  the ventilation component includes:
    a supporting portion being annular and surrounding the ventilation path in plan view;
    a gas-permeable membrane closing the ventilation path in a ventilatable manner;
    a protruding portion protruding from the supporting portion toward the inner space, and being inserted into the attachment hole to be in contact with the housing; and
    a sealing member disposed on an outer periphery of the protruding portion, and sealing a gap between the first surface and the protruding portion.

The present invention also provides a ventilation structure including:
  a housing including an outward protruding portion protruding outward, the housing having an attachment hole formed in a top portion of the outward protruding portion; and
  a ventilation component attached to the housing to close the attachment hole, and having a ventilation path between an inner space of the housing and an outer space of the housing, wherein
  the ventilation component includes:
    a supporting portion being annular and surrounding the ventilation path in plan view;
    a gas-permeable membrane closing the ventilation path in a ventilatable manner;
    a protruding portion protruding from the supporting portion toward the inner space, and being inserted into the attachment hole to be in contact with the housing;
    a lateral portion being annular and surrounding the outward protruding portion in plan view; and
    a sealing member sealing a gap between a lateral surface of the outward protruding portion and the lateral portion.

Advantageous Effects of Invention

In the ventilation structure, the sealing member has a contact area for sealing that is less likely to decrease due to a change in environmental conditions.

DESCRIPTION OF EMBODIMENTS

Embodiments of the present invention will be described below with reference to the accompanying drawings. The following description describes examples of the present invention, and the present invention is not limited to the following embodiments.

Figure 1:
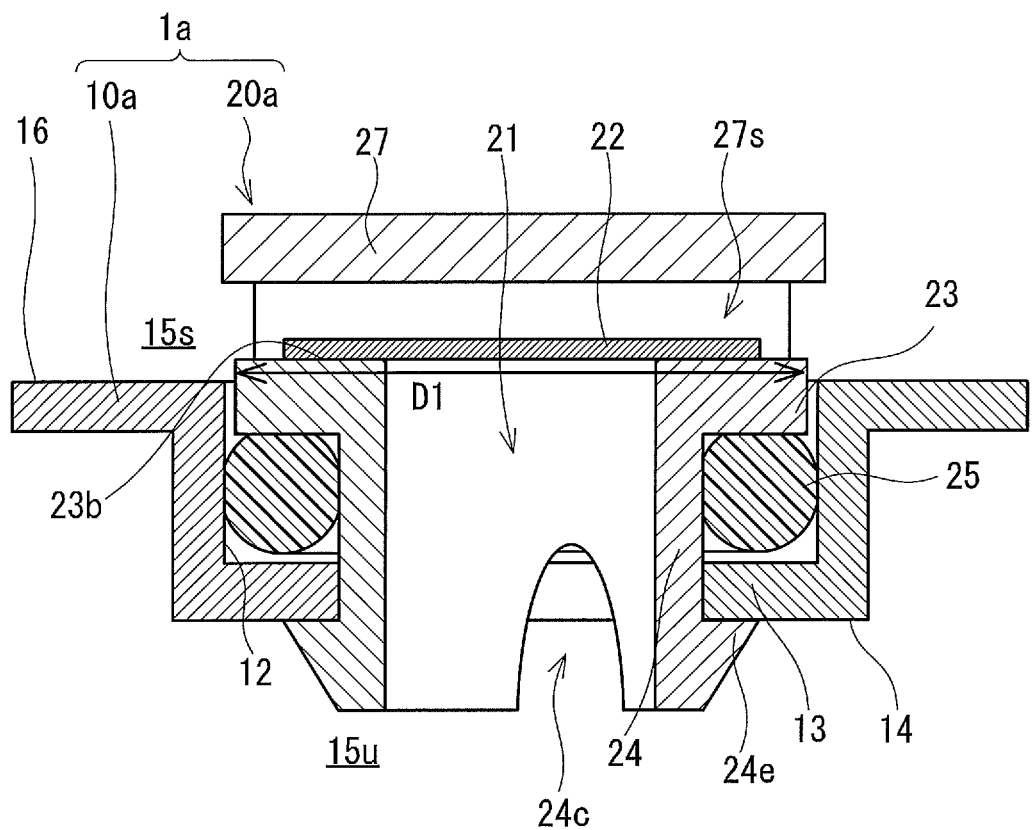
FIG. 1 is a cross-sectional view showing an example of a ventilation structure according to the present invention.
Figure 2:
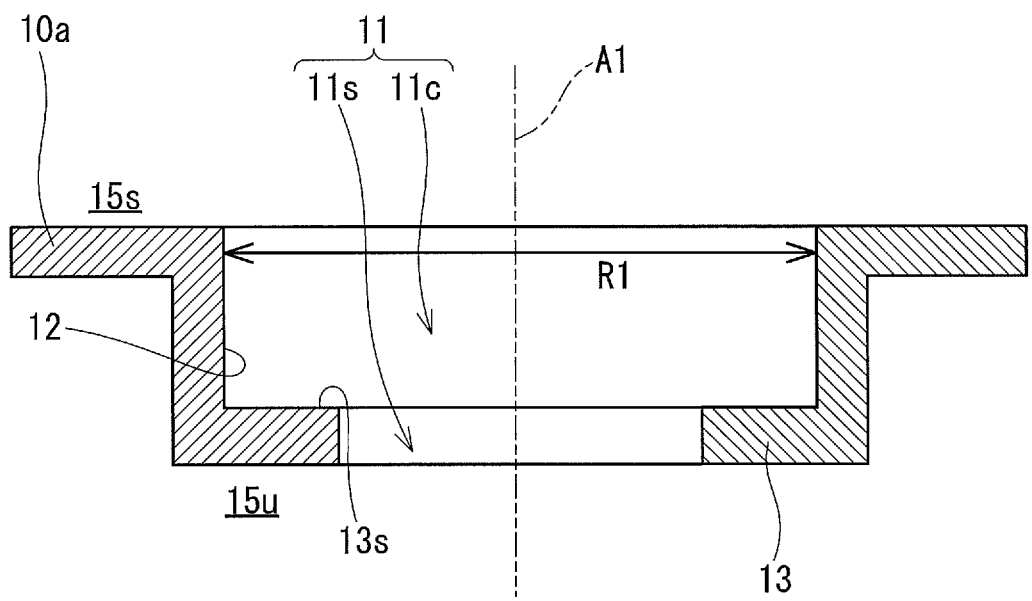
FIG. 2 is a cross-sectional view showing a housing of the ventilation structure shown in FIG. 1.

As shown in FIG. 1, a ventilation structure 1*a* includes a housing 10*a* and a ventilation component 20*a*. As shown in FIG. 2, the housing 10*a* has an attachment hole 11. In addition, the housing 10*a* has a first surface 12 defining a lateral surface of a columnar space 11*c* in the attachment hole 11. The ventilation component 20*a* is attached to the housing 10*a* to close the attachment hole 11. The ventilation component 20*a* has a ventilation path 21 between an inner space 15*u* of the housing 10*a* and an outer space 15*s* of the housing 10*a*. The columnar space 11*c* is for example adjacent to the outer space 15*s*.

The ventilation component 20*a* includes a supporting portion 23, a gas-permeable membrane 22, a protruding portion 24, and a sealing member 25. The supporting portion 23 is an annular part surrounding the ventilation path 21 in plan view. The gas-permeable membrane 22 closes the ventilation path 21 in a ventilatable manner. The protruding portion 24 protrudes from the supporting portion 23 toward the inner space 15*u* of the housing 10*a*. In addition, the protruding portion 24 is inserted into the attachment hole 11 to be in contact with the housing 10*a*. The sealing member 25 is disposed on an outer periphery of the protruding portion 24, and seals a gap between the first surface 12 and the protruding portion 24. For example, the sealing member 25 is compressively deformed in a direction perpendicular to an axis A1 of the attachment hole 11 by the first surface 12 and the protruding portion 24. Accordingly, the contact area between the sealing member 25 and each of the housing 10*a* and the protruding portion 24 is likely to be a desired value, and thus a favorable sealing performance is likely to be achieved. The annular supporting portion 23 may have an annular ring shape in which contours of an inner circumference and an outer circumference of the supporting portion 23 are circles in plan view, or may have an annular shape in which at least one of the contours of the inner circumference and the outer circumference is a planar figure other than a circle in plan view.

In the techniques described in Patent Literatures 1 and 2, the elastic modulus of predetermined parts of the ventilation member such as the leg portion of the support and the insertion portion might decrease due to a change in environmental conditions such as the occurrence of a high temperature environment. Such a decrease in elastic modulus causes inward deformation of the leg portion of the support and the insertion portion. The occurrence of such a deformation generates a gap between the leg portion of the support and the housing or between the insertion portion and the housing, and thus the deformation of the seal ring or the sealing portion is partially disappeared. Consequently, the ventilation member might move along the axis of the opening portion in a direction in which the ventilation member becomes detached from the housing. In the ventilation structure described in Patent Literature 1, since the seal ring is deformed along the taper of the opening portion, the occurrence of such a movement of the ventilation member partially disappears the compressive deformation of the seal ring, so that the contact area between the seal ring and the opening portion decreases. In the ventilation housing described in Patent Literature 2, since the sealing portion is disposed between the supporting portion and an outer surface of the housing, movement of the ventilation member along the axis of the opening portion in the direction in which the ventilation member becomes detached from the housing decreases the contact area between the sealing portion and each of the supporting portion and the outer surface of the housing. For this reason, the techniques described in Patent Literatures 1 and 2 cannot be considered to be advantageous from the viewpoint of suppressing that the contact area for sealing in the seal ring member decreases due to a change in environmental conditions.

In contrast, according to the ventilation structure 1*a*, for example, the sealing member 25 is compressively deformed in the direction perpendicular to the axis A1 of the attachment hole 11 by the first surface 12 and the protruding portion 24. Accordingly, even when the elastic modulus of the protruding portion 24 decreases due to a change in environmental conditions, the ventilation component 20*a* is less likely to move along the axis A1 of the attachment hole 11 in a direction in which the ventilation component 20*a* becomes detached from the housing 10*a*. Thus, the contact area between the sealing member 25 and each of the first surface 12 and the protruding portion 24 is less likely to decrease. As a result, even when a change in environmental conditions occurs in the ventilation structure 1*a*, a favorable sealing performance is likely to be achieved. The sealing member 25 is typically an annular member.

In the ventilation structure 1*a*, the housing 10*a* is for example a housing of an electronic device. The electronic device is for example an electronic device for automobiles such as an electronic control unit (ECU), an electric power system (EPS), a battery pack, an inverter, a converter, a millimeter wave radar, and an in-vehicle camera. The electronic device may be one used for applications other than applications for automobiles. According to the ventilation structure 1*a*, it is possible to eliminate, by the ventilation path 21, a differential pressure generated between the inner space 15*u* and the outer space 15*s* of the housing 10*a* due to a temperature change. In addition, since the gas-permeable membrane 22 closes the ventilation path 21, a foreign matter can be prevented from entering the inner space 15*u*, and the ventilation structure 1*a* for example has dust resistance. Further, the ventilation structure 1*a* can prevent water, oil, salt, and the like from entering the inner space.

For example, it is assumed that when washing a device, a vehicle, or a facility on which the housing 10*a* is mounted, a high-pressure water jet is emitted toward the ventilation structure 1*a* in the direction perpendicular to the axis A1 of the attachment hole 11. As described above, the sealing member 25 seals the gap between the first surface 12 and the protruding portion 24. Accordingly, sealed portions between the sealing member 25 and each of the first surface 12 and the protruding portion 24 are less likely to receive a high-pressure water jet. Even when a high-pressure water jet is emitted toward the ventilation structure 1*a*, the sealing member 25 exhibits a favorable sealability and thus water is less likely to enter the inner space 15*u* of the housing 10*a*.

As shown in FIG. 1, the first surface 12 is for example positioned closer to the inner space 15*u* of the housing 10*a* adjacent to the attachment hole 11 than an outer surface 16 of the housing 10*a* around the attachment hole 11 is. With such a structure, the height of the portion protruding outside the housing 10*a* in the ventilation structure 1*a* can be easily reduced. The first surface 12 may be positioned closer to the outer space 15*s* of the housing 10*a* adjacent to the attachment hole 11 than the outer surface 16 of the housing 10a around the attachment hole 11 is.

As shown in FIG. 1, the sealing member 25 is for example placed in the attachment hole 11. Typically, the entire sealing member 25 is disposed inside the attachment hole 11. In this case, the sealing member 25 is less likely to receive a high-pressure water jet, and thus deformation of the sealing member 25 can be prevented. Accordingly, even when a high-pressure water jet is emitted toward the ventilation structure 1a, water can be more reliably prevented from entering the inner space 15u of the housing 10a.

As shown in FIG. 1, the supporting portion 23 is at least partially disposed inside the space surrounded by the first surface 12. With such a structure, an end portion of the supporting portion 23 in the direction perpendicular to the axis of the attachment hole 11 at least partially faces the first surface 12. Accordingly, the ventilation component 20a is less likely to fall down in a lateral direction perpendicular to the axis of the attachment hole 11. The entire supporting portion 23 may be disposed inside the space surrounded by the first surface 12, or the entire supporting portion 23 may be disposed outside the space surrounded by the first surface 12.

The supporting portion 23 has an outer diameter D1 smaller than a hole diameter R1. The hole diameter R1 is the diameter of the attachment hole 11 at the end of the attachment hole 11 adjacent to the outer space 15s of the housing 10a. Owing to the outer diameter D1 being smaller than the hole diameter R1, when the ventilation component 20a is attached to the housing 10a, the supporting portion 23 is less likely to contact the housing 10a. Thus, the dimensional tolerance required for the housing 10a and the ventilation component 20a can be easily increased. The outer diameter D1 is for example slightly smaller than the hole diameter R1. Accordingly, a minute gap can be created between the housing 10a and the supporting portion 23.

The protruding portion 24 for example has a locking portion 24e. The locking portion 24e is locked to the housing 10a. The locking portion 24e is for example in contact with the inner surface 14 of the housing 10a. Accordingly, the ventilation component 20a is less likely to become detached from the housing 10a. The locking portion 24e is formed at a tip portion of the protruding portion 24. The locking portion 24e is locked to the housing 10a for example by snap-fitting. The protruding portion 24 is for example tubular, and the locking portion 24e for example protrudes outward in a direction perpendicular to the axis of the protruding portion 24. For example, one or more slits 24c are formed at the tip portion of the locking portion 24e in the peripheral direction. Accordingly, the tip portion of the protruding portion 24 is likely to become elastically deformed in the direction perpendicular to the axis of the protruding portion 24, and thus the ventilation component 20a can be easily attached to the housing 10a. The locking portion 24e may be locked to the housing 10a by screwing, or may be locked to the housing 10a with a bayonet.

The supporting portion 23 and the protruding portion 24 may be integrally molded to be a component. Alternatively, the supporting portion 23 and the protruding portion 24 may be separately produced components. The material of the supporting portion 23 and the protruding portion 24 is for example a thermoplastic resin from the viewpoint of moldability. The thermoplastic resin can be for example polyamide (PA), polyethylene terephthalate (PET), polyphenylene sulfide (PPS), polybutylene terephthalate (PBT), polycarbonate (PC), polypropylene (PP), polyphenylene ether (PPE), or a thermoplastic elastomer. The material of the supporting portion 23 and the protruding portion 24 may be a thermosetting resin, or may be a metal. The material of the supporting portion 23 and the protruding portion 24 may be a rubber. The rubber is for example nitrile butadiene rubber (NBR), ethylene propylene rubber (EPDM), silicone rubber, fluorine rubber, acrylic rubber, or hydrogenated nitrile rubber.

As shown in FIG. 2, the housing 10a for example has a bottom portion 13. The bottom portion 13 is disposed closer to the inner space 15u of the housing 10a than the sealing member 25 is. The bottom portion 13 protrudes from the first surface 12 toward the axis A1 of the attachment hole 11. In this case, the locking portion 24e of the protruding portion 24 is configurable to be locked to the bottom portion 13. Thus, the tip portion of the protruding portion 24 can be easily shaped to have a linear and simple structure. In addition, since the sealing member 25 seals the gap between the first surface 12 and the protruding portion 24, the force applied to the locking portion 24e is likely to be small compared with a case where the sealing member is deformed to be compressed in the axial direction of the attachment hole. Accordingly, distortion of the tip portion of the protruding portion 24 can be prevented, and thus the locking portion 24e can be easily reduced in size.

The bottom portion 13 is for example annular. The attachment hole 11 includes an opening 11s surrounded by the bottom portion 13. The protruding portion 24 is for example in contact with the bottom portion 13. With such a structure of the housing 10a, the dimension of the protruding portion 24 in the direction perpendicular to the axis of the protruding portion 24 can be easily reduced. Also, the sealing member 25 is less likely to be exposed in the inner space 15u. Further, it is possible to prevent the sealing member 25 from accidentally entering the inner space 15u when the ventilation component 20a is attached to the housing 10a.

The supporting portion 23 typically has an adherend surface 23b to which the gas-permeable membrane 22 is attached. The adherend surface 23b is for example an annular surface. The gas-permeable membrane 22 for example overlaps the opening 11s in the direction perpendicular to the axis A1 of the attachment hole 11. For example, a central portion of the gas-permeable membrane 22 overlaps the entire opening 11s. Since the housing 10a has the annular bottom portion 13, the dimension of the gas-permeable membrane 22 can be easily reduced.

The bottom portion 13 has an outer surface 13s facing the sealing member 25. The adherend surface 23b for example faces in a direction identical to a direction in which the outer surface 13s faces. In this case, the state of the gas-permeable membrane 22 can be easily checked visually.

The gas-permeable membrane 22 is not limited to any particular gas-permeable membrane as long as the gas-permeable membrane 22 has a desired gas-permeability. The gas-permeable membrane 22 may be a single layer membrane, or may be a multilayer membrane. In the case where the gas-permeable membrane 22 is a multilayer membrane, each layer thereof can be one selected from the group consisting of a porous membrane, a nonwoven fabric, a cloth, and a mesh. The gas-permeable membrane 22 may include: a porous membrane and a nonwoven fabric; at least one of a cloth and a mesh, and a porous membrane; or a plurality of nonwoven fabrics. The gas-permeable membrane 22 is typically composed of an organic polymer material (resin). The material of the porous membrane is for example a fluororesin. Examples usable as the fluororesin include polytetrafluoroethylene (PTFE), polychlorotrifluoroethylene, a tetrafluoroethylene-hexafluoropropylene copolymer, and a tetrafluoroethylene-ethylene copolymer. The material of the porous membrane may be a polyolefin obtained by polymerization of any one of monomers including ethylene, propylene, and 4-methylpentene-1,1 butene or copolymerization of these monomers. The porous membrane may be a porous membrane of a nanofiber such as polyacrylonitrile, nylon, or polylactic acid. The porous membrane may be manufactured by a known stretching method or extraction method. Examples of materials of the nonwoven fabric, the cloth, and the mesh include polyester such as polyethylene terephthalate, polyolefin such as polyethylene and polypropylene, nylon, aramid, and an ethylene-vinyl acetate copolymer.

The gas-permeable membrane 22 desirably includes a porous PTFE membrane. The porous PTFE membrane even with a small area can achieve gas permeability, and accordingly can effectively prevent foreign matter entrance. The porous PTFE membrane may be layered on a gas-permeable supporting member such as a nonwoven fabric.

The gas-permeable membrane 22 may be subject to a liquid-repellant treatment as necessary. The liquid-repellant treatment is performed for example by forming, on the gas-permeable membrane 22, a liquid-repellant coating film containing a fluorine surface modifier having a perfluoroalkyl group. The method for forming the liquid-repellant coating film is not limited to any particular method. The formation of the liquid-repellant coating film may be performed for example by coating a resin porous membrane with a solution or dispersion of a fluorine surface modifier having a perfluoroalkyl group by a method such as an air spray method, an electrostatic spray method, a dip coating method, a spin coating method, a roll coating method, a curtain flow coating method, or an impregnation method. The liquid-repellant coating film may be formed by an electrodeposition method or a plasma polymerization method.

The gas-permeable membrane 22 is for example adhered to the adherend surface 23b. The gas-permeable membrane 22 may be welded to the adherend surface 23b. Usable as a welding method are heat welding, ultrasonic welding, and laser welding. Also, the gas-permeable membrane 22 may be attached to the adherend surface 23b by, in molding of the supporting portion 23, performing insert molding in which a resin is poured into a mold for molding with the gas-permeable membrane 22 disposed at a predetermined position inside the mold. The gas-permeable membrane 22 may be attached to the adherend surface 23b with a double-sided adhesive tape.

The sealing member 25 is not limited to any particular sealing member as long as the sealing member 25 has a desired sealability. In a state where the ventilation component 20a is detached from the housing 10a, a cross section of the sealing member 25 along a plane including an axis of the sealing member 25 is for example a circle, an ellipse, or a plane having an angle. The plane having an angle may be a polygon, or may be a figure formed from a curved line and a straight line in combination. The sealing member 25 may have a hollow structure with an annular inner space.

The material of the sealing member 25 is not limited to any particular material as long as the sealing member 25 can exhibit a desired sealability. For example, the material exemplified as the material of the supporting portion 23 and the protruding portion 24 can be used as the material of the sealing member 25. The sealing member 25 is typically an elastic body that is elastically deformable in the ventilation structure 1a, and the material of the sealing member 25 can be a natural rubber, a synthetic rubber, or an elastomer such as thermoplastic elastomer.

As shown in FIG. 1, the ventilation component 20a for example further includes a cap 27. The cap 27 is coupled to the supporting portion 23. The cap 27 covers the gas-permeable membrane 22, and defines a space 27s communicating with an outer space of the ventilation component 20a between the cap 27 and the gas-permeable membrane 22. The space 27s forms part of the ventilation path 21. This protects the gas-permeable membrane 22 appropriately. Further, even when a high-pressure water jet is emitted along the axis A1 of the attachment hole 11, the sealing member 25 can be prevented from receiving the high-pressure water jet.

At least one of the supporting portion 23 and the cap 27 may have a lateral wall disposed on an outer periphery of the space 27s. The lateral wall can include a plurality of lateral walls spaced apart from each other at predetermined intervals in the peripheral direction. The supporting portion 23 and the cap 27 each may have a plurality of lateral walls spaced apart from each other at predetermined intervals in the peripheral direction. In this case, the lateral walls of the supporting portion 23 and the lateral walls of the cap 27 may partially overlap each other in the peripheral direction. Accordingly, even when a high-pressure water jet is emitted in the direction perpendicular to the axis A1 of the attachment hole 11, water is less likely to enter the space 27s.

The ventilation structure 1a can be modified from various perspectives. For example, the ventilation structure 1a may be modified to a ventilation structure 1b shown in FIG. 3, a ventilation structure 1c shown in FIG. 4, a ventilation structure 1d shown in FIG. 5, a ventilation structure 1e shown in FIG. 6, or a ventilation structure 1f shown in FIG. 7. The ventilation structures 1b to 1f are each configured in a similar manner to the ventilation structure 1a except portions particularly otherwise described. Respective constituent elements of the ventilation structures 1b to 1f that are identical to or correspond to those of the ventilation structure 1a are denoted by the same reference numerals, and detailed descriptions thereof will be omitted. The description given for the ventilation structure 1a applies to the ventilation structures 1b to 1f unless there is a technical inconsistency.

Figure 3:
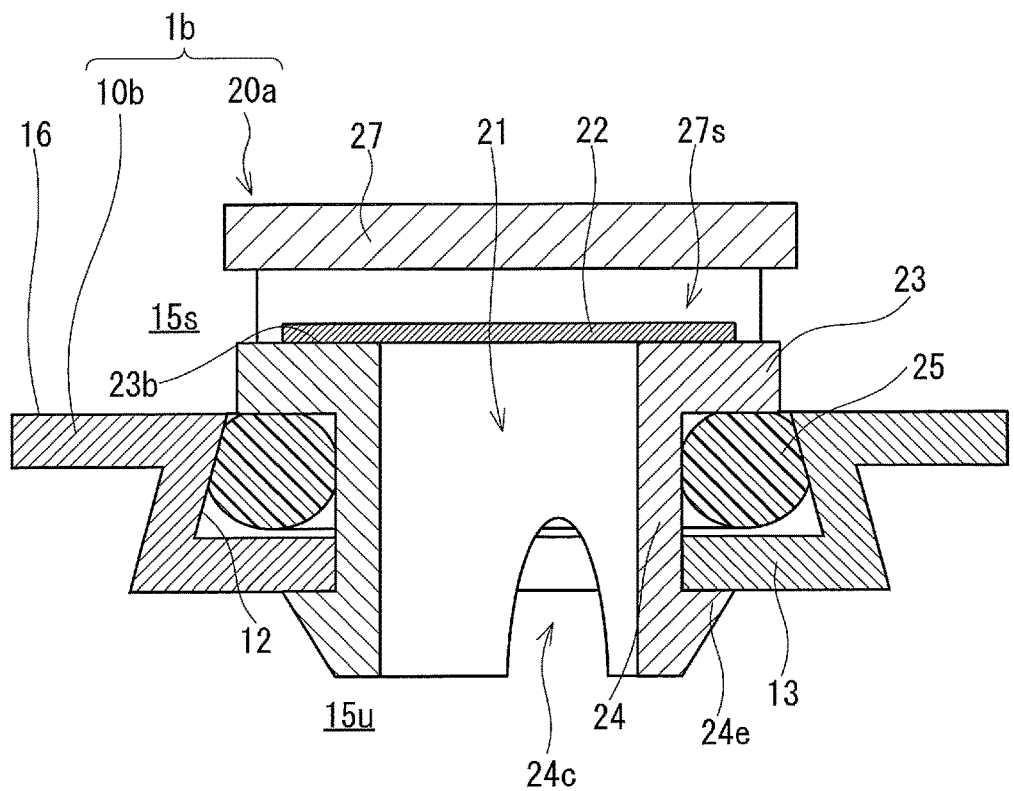
FIG. 3 is a cross-sectional view showing another example of the ventilation structure according to the present invention.

As shown in FIG. 3, the ventilation structure 1b includes a housing 10b instead of the housing 10a. The housing 10b is configured in a similar manner to the housing 10a except portions particularly otherwise described. In the housing 10b, the first surface 12 defines a taper in the attachment hole 11 in which a hole diameter decreases in a direction from the inner space 15u of the housing 10b toward the outer space 15s of the housing 10b. This taper for example defines a space having a conical frustum shape. With such a structure, even when a change in environmental conditions occurs in the ventilation structure 1b, the ventilation component 20a is less likely to move along the axis A1 of the attachment hole 11 in the direction in which the ventilation component 20a becomes detached from the housing 10b. As a result, the contact area between the sealing member 25 and each of the first surface 12 and the protruding portion 24 is less likely to decrease. Thus, even when a change in environmental conditions occurs in the ventilation structure 1a, a favorable sealing performance is likely to be achieved.

In a state where the ventilation component 20a is detached from the housing 10b, the space defined by the taper of the first surface 12 is adjacent to the outer space 15s of the housing 10b.

Figure 4:
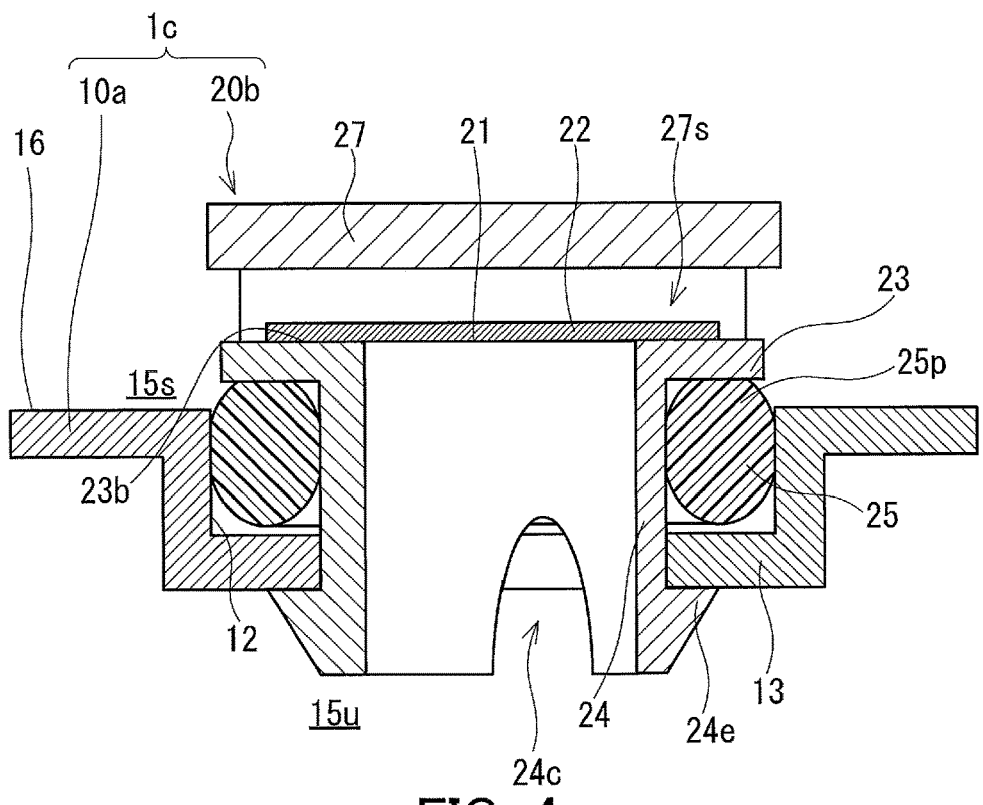
FIG. 4 is a cross-sectional view showing still another example of the ventilation structure according to the present invention.

As shown in FIG. 4, the ventilation structure 1c includes a ventilation component 20b instead of the ventilation component 20a. The ventilation component 20b is configured in a similar manner to the ventilation component 20a except portions particularly otherwise described. In the ventilation structure 1c, the sealing member 25 includes a portion 25p protruding over the first surface 12 to the outer space of the housing 10a. With such a structure, it is possible to prevent accumulation of salt water or the like inside the attachment hole 11, thereby preventing corrosion of the housing 10a.

Figure 5:
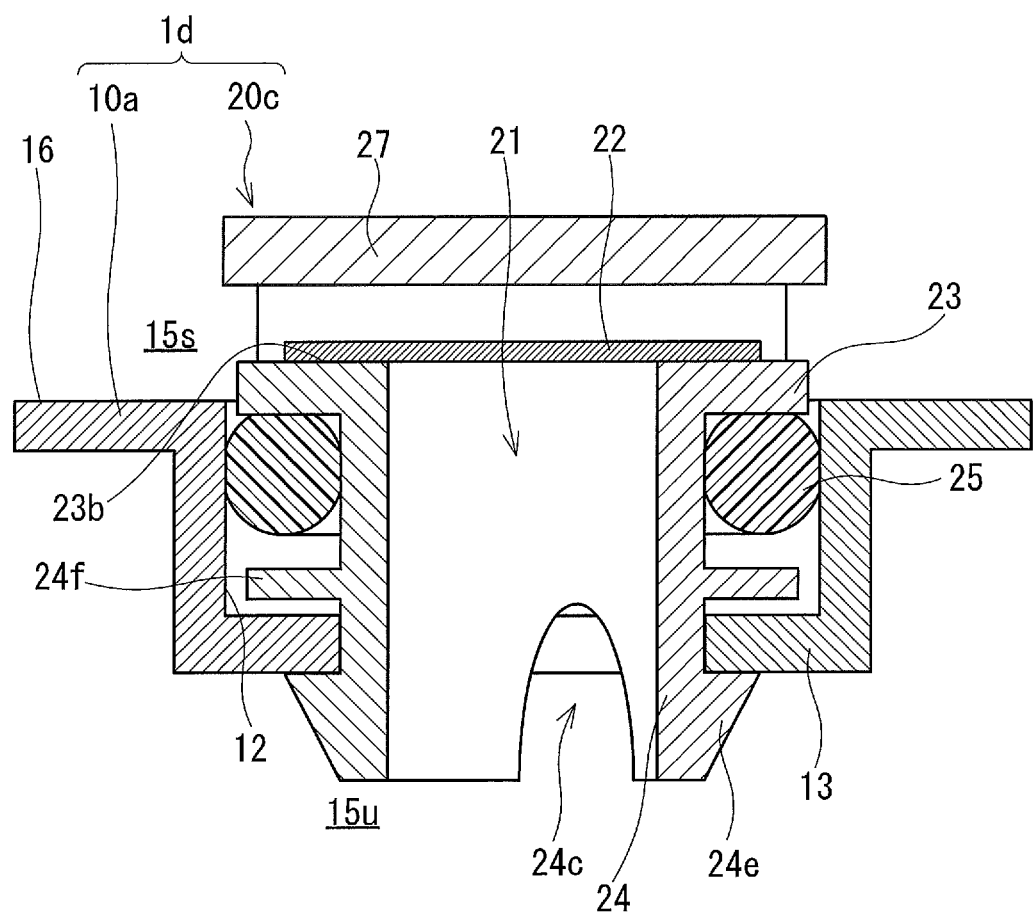
FIG. 5 is a cross-sectional view showing still another example of the ventilation structure according to the present invention.

As shown in FIG. 5, the ventilation structure 1d includes a ventilation component 20c instead of the ventilation component 20a. The ventilation component 20c is configured in a similar manner to the ventilation component 20a except portions particularly otherwise described. In the ventilation component 20c, the protruding portion 24 has a flange 24f. The flange 24f protrudes toward the first surface 12 at a position closer to the inner space 15u of the housing 10a than the sealing member 25. With such a structure, the protruding portion 24 is likely to have a high strength. The outer diameter of the flange 24f is for example smaller than the hole diameter of the attachment hole 11 in the columnar space 11c.

The flange 24f for example is formed at a position closer to the supporting portion 23 than the slits 24c.

Figure 6:
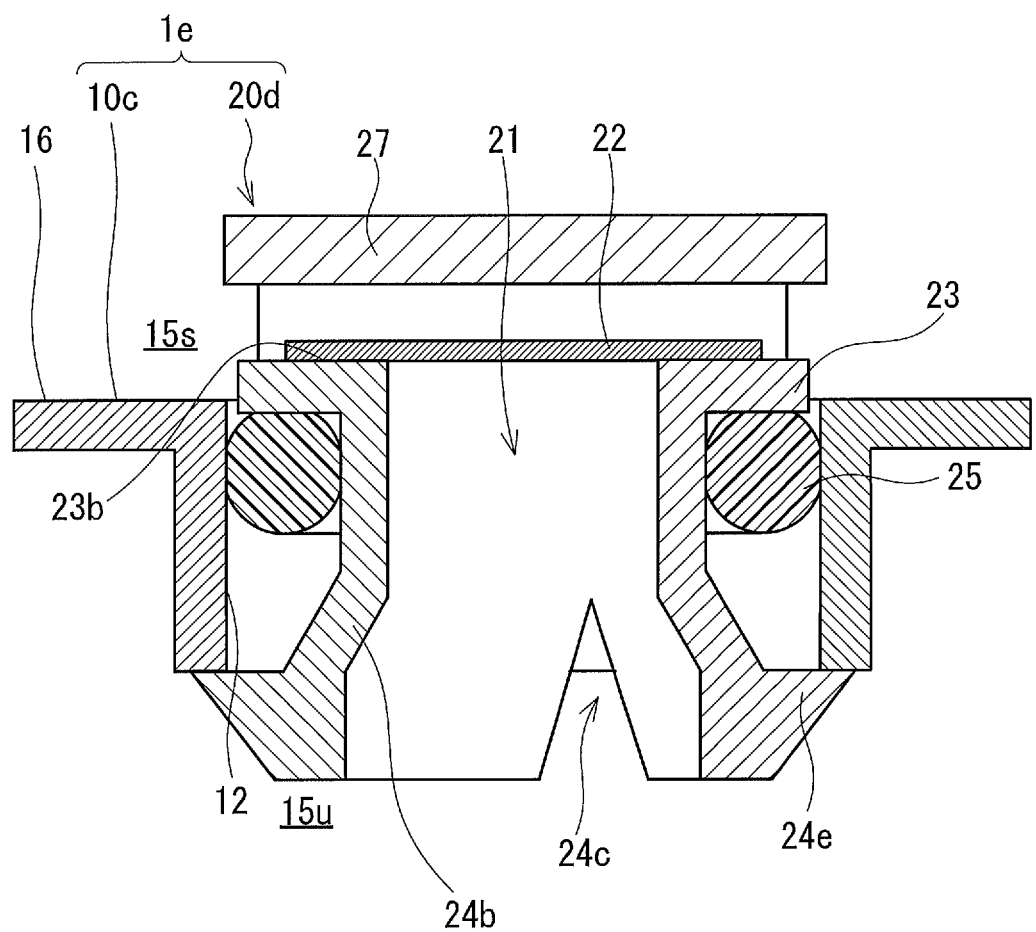
FIG. 6 is a cross-sectional view showing still another example of the ventilation structure according to the present invention.

As shown in FIG. 6, the ventilation structure 1e includes a housing 10c instead of the housing 10a, and includes a ventilation component 20d instead of the ventilation component 20a. The housing 10c is configured in a similar manner to the housing 10a except portions particularly otherwise described. The ventilation component 20d is configured in a similar manner to the ventilation component 10c except portions particularly otherwise described.

The ventilation component 20d has an inverse tapered portion 24b. The inverse tapered portion 24b has an outer diameter increasing in a direction from the outer space 15s of the housing 10c toward the inner space 15u of the housing 10c. In a tip portion of the inverse tapered portion 24b, the locking portion 24e is formed. With such a structure, even in the case where the hole diameter of the attachment hole 11 in the housing 10c is large, the size required for the gas-permeable membrane 22 can be reduced. The slits 24c are for example formed in the inverse tapered portion 24b.

As shown in FIG. 6, in the housing 10c, the attachment hole 11 is defined only by the first surface 12, and the housing 10c has no bottom portion 13. According to the ventilation structure 1e, even in such a case, the size required for the gas-permeable membrane 22 can be reduced.

Figure 7:
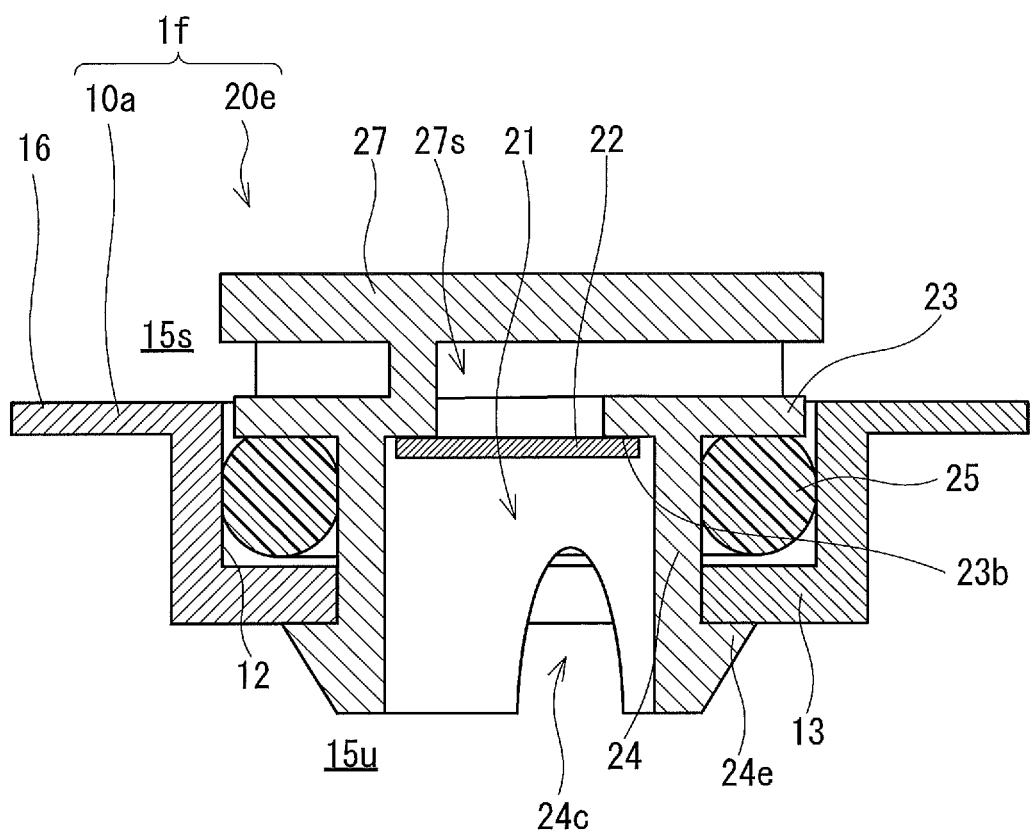
FIG. 7 is a cross-sectional view showing still another example of the ventilation structure according to the present invention.

As shown in FIG. 7, the ventilation structure 1f includes a ventilation component 20e instead of the ventilation component 20a. The ventilation component 20e is configured in a similar manner to the ventilation component 20a except portions particularly otherwise described. In the ventilation component 20e, the adherend surface 23b of the supporting portion 23 faces the inner space 15u. With such a structure, since the gas-permeable membrane 22 is disposed at a position close to the inner space 15u, the gas-permeable membrane 22 can be easily protected. Further, the size of the gas-permeable membrane 22 can be made smaller than the inner diameter of the protruding portion 24.

In the ventilation structure 1f, the supporting portion 23 and the cap 27 are for example integrally molded. The cap 27 for example has a flat outer surface. With such a structure, it is possible to perform a work of attaching the gas-permeable membrane 22 to the adherend surface 23b with the flat outer surface of the cap 27 fixed to a flat plane. Accordingly, the work of attaching the gas-permeable membrane 22 to the adherend surface 23b is easy.

Figure 8:
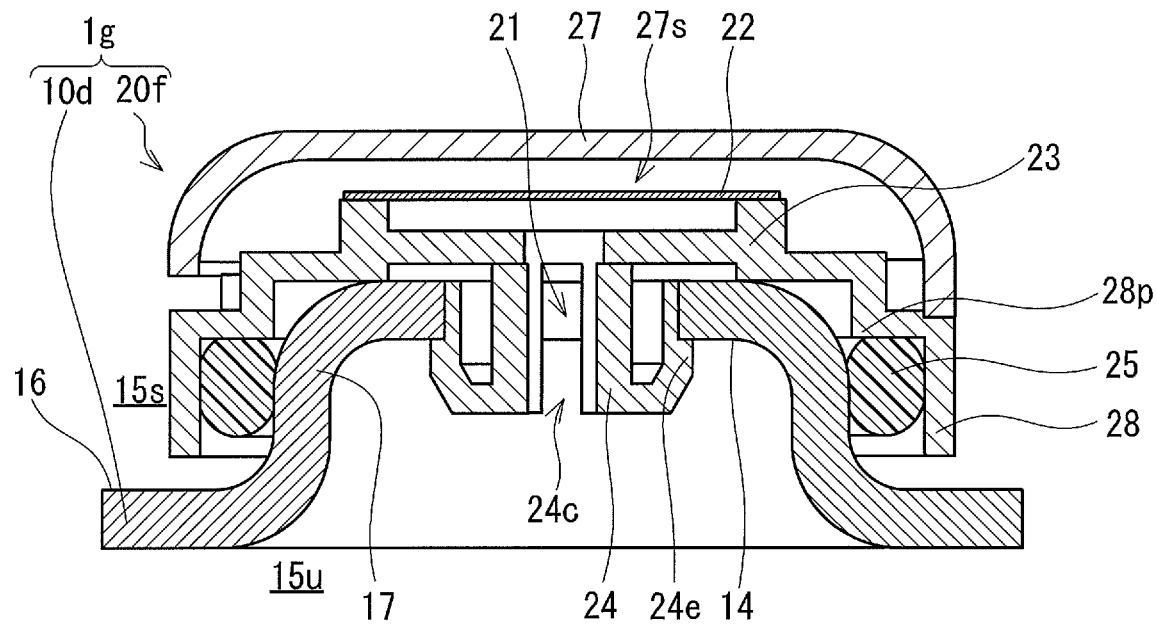
FIG. 8 is a cross-sectional view showing still another example of the ventilation structure according to the present invention.

It is also possible to provide a ventilation structure 1g shown in FIG. 8. The ventilation structure 1g is configured in a similar manner to the ventilation structure 1a except portions particularly otherwise described. Constituent elements of the ventilation structure 1g that are identical to or correspond to those of the ventilation structure 1a are denoted by the same reference numerals, and detailed descriptions thereof will be omitted. The description given for the ventilation structure 1g applies to the ventilation structure 1g unless there is a technical inconsistency.

Figure 9:
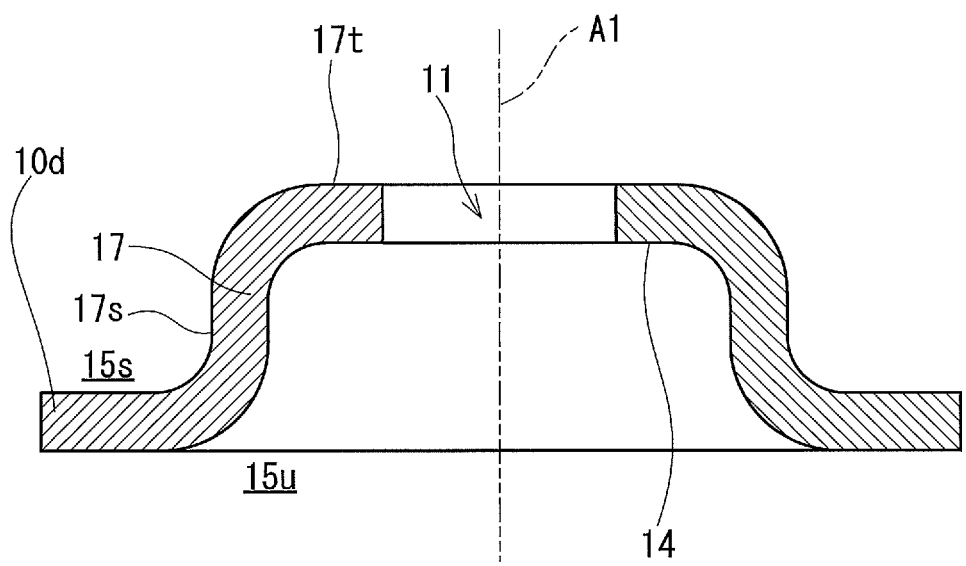
FIG. 9 is a cross-sectional view showing a housing of the ventilation structure shown in FIG. 8.

The ventilation structure 1g includes a housing 10d and a ventilation component 20f. As shown in FIG. 9, the housing 10d includes an outward protruding portion 17 protruding outward. In addition, the housing 10d has an attachment hole 11 formed in a top portion of the outward protruding portion 17. The ventilation component 20f is attached to the housing 10d to close the attachment hole 11. The ventilation component 20f has a ventilation path 21 between an inner space 15u and an outer space 15s of the housing 10d. The ventilation component 20f includes an annular supporting portion 23, a gas-permeable membrane 22, a protruding portion 24, an annular lateral portion 28, and a sealing member 25. The supporting portion 23 surrounds the ventilation path 21 in plan view. The gas-permeable membrane 22 closes the ventilation path 21 in a ventilatable manner. The protruding portion 24 protrudes from the supporting portion 23 toward the inner space 15u. In addition, the protruding portion 24 is inserted into the attachment hole 11 to be in contact with the housing 10d. The lateral portion 28 surrounds the outward protruding portion 17 in plan view. The sealing member 25 seals a gap between a lateral surface 17s of the outward protruding portion 17 and the lateral portion 28. The annular supporting portion 23 may have an annular ring shape in which contours of an inner circumference and an outer circumference of the supporting portion 23 are circles in plan view, or may have an annular shape in which at least one of the contours of the inner circumference and the outer circumference is a planar figure other than a circle in plan view.

According to the ventilation structure 1g, for example, the sealing member 25 is compressively deformed in a direction perpendicular to an axis A1 of the attachment hole 11 by the lateral surface 17s and the lateral portion 28. Accordingly, even when the elastic modulus of the protruding portion 24 decreases due to a change in environmental conditions, the ventilation component 20f is less likely to move along the axis A1 of the attachment hole 11 in the direction in which the ventilation component 20f becomes detached from the housing 10d. Thus, the contact area between the sealing member 25 and each of the lateral surface 17s and the lateral portion 28 is less likely to decrease. As a result, even when a change in environmental conditions occur in the ventilation structure 1g, a favorable sealing performance is likely to be achieved. The sealing member 25 is typically an annular member.

Since the housing 10d includes the outward protruding portion 17, even when a liquid such as salt water adheres to the outward protruding portion 17, the liquid is quickly discharged, thereby preventing accumulation of the liquid around the outward protruding portion 17. This can prevent corrosion of the housing 10d.

The outward protruding portion 17 is for example tubular, and defines a columnar space thereinside. The attachment hole 15 is typically formed in the center of a top portion 17t. The top portion 17t is formed for example such that an inner surface 14 of the housing 10d in the top portion 17t has an annular plane perpendicular to the axis A1. The outward protruding portion 17 is for example curved to protrude toward the inner space 15u of the housing 10d at the base of the outward protruding portion 17. Accordingly, even when a liquid adheres to the outward protruding portion 17, the liquid is likely to be discharged quickly.

For example, it is assumed that when washing a device, a vehicle, or a facility on which a housing 10d is mounted, a high-pressure water jet is emitted toward the ventilation structure 1g in the direction perpendicular to the axis A1 of the attachment hole 11. As described above, the sealing member 25 seals a gap between the lateral surface 17s and the lateral portion 28. Accordingly, sealed portions between the sealing member 25 and each of the lateral surface 17s and the lateral portion 28 are less likely to receive a high-pressure water jet. Even when a high-pressure water jet is emitted toward the ventilation structure 1g, the sealing member 25 exhibits a favorable sealability and thus water is less likely to enter the inner space 15u of the housing 10d. The lateral portion 28 desirably covers the sealing member 25. In other words, the sealing member 25 is not visible when the ventilation structure 1g is viewed along the direction perpendicular to the axis A1 of the attachment hole 11. With such a structure, it is more reliable that, in the ventilation structure 1g, the sealed portions between the sealing member 25 and each of the lateral surface 17s and the lateral portion 28 are less likely to receive a high-pressure water jet.

As shown in FIG. 8, the lateral portion 28 is for example coupled to the supporting portion 23. With such a structure, the lateral portion 28 is less likely to deform, and thus the contact area between the sealing member 25 and the lateral portion 28 is less likely to decrease. The lateral portion 28 may be molded integrally with the supporting portion 23, or may be fixed to the supporting portion 23.

The lateral portion 28 for example has a laterally protruding portion 28p. The laterally protruding portion 28p protrudes toward the outward protruding portion 17. With such a structure, the position of the sealing member 25 in a direction parallel to the axis A1 of the attachment hole 11 is easily adjusted to a desired position.

The laterally protruding portion 28p is desirably in contact with the sealing member 25. With such a structure, the contact area between the sealing member 25 and the lateral portion 28 is likely to increase, and thus the sealing performance in the ventilation structure 1g is likely to be further enhanced.

The protruding portion 24 for example has a locking portion 24e locked to the housing 10d. The locking portion 24e is for example in contact with the inner surface 14 of the housing 10d. Accordingly, the ventilation component 20f is less likely to become detached from the housing 10d. The locking portion 24e is formed at the tip portion of the protruding portion 24. The locking portion 24e is locked to the housing 10d for example by snap-fitting. The protruding portion 24 is for example tubular, and the locking portion 24e for example protrudes outward in the direction perpendicular to the axis of the protruding portion 24. For example, one or more slits 24c are formed in the protruding portion 24 in the peripheral direction. Accordingly, the protruding portion 24 is likely to become elastically deformed in the direction perpendicular to the axis of the protruding portion 24, and the ventilation component 20f is easily attached to the housing 10d. The locking portion 24e may be locked to the housing 10d by screwing, or may be locked to the housing 10d with a bayonet.

The ventilation component 20f may for example further include a cap 27. The cap 27 is coupled to the supporting portion 23. The cap 27 covers the gas-permeable membrane 22, and defines a space 27s communicating with the outer space of the ventilation component 20f between the cap 27 and the gas-permeable membrane 22. This protects the gas-permeable membrane 22 appropriately. Further, even when a high-pressure water jet is emitted along the axis A1 of the attachment hole 11, the sealing member 25 can be prevented from receiving the high-pressure water jet.

In a state where the ventilation component 20f is detached from the housing 10d, a cross section of the sealing member 25 along a plane including the axis A1 is not limited to any particular shape. The cross section is for example a circle, an ellipse, or a plane having an angle.

The invention claimed is:

1. A ventilation structure comprising:
a housing having an attachment hole and a first surface, the first surface: defining a lateral surface of a columnar space in the attachment hole; or defining a taper in the attachment hole in which a hole diameter decreases in a direction from an inner space of the housing toward an outer space of the housing; and
a ventilation component attached to the housing to close the attachment hole, and having a ventilation path between the inner space of the housing and the outer space of the housing, wherein
the ventilation component comprises:
a supporting portion being annular and surrounding the ventilation path in plan view;
a gas-permeable membrane closing the ventilation path in a ventilatable manner;
a protruding portion protruding from the supporting portion toward the inner space, and being inserted into the attachment hole to be in contact with the housing; and
a sealing member disposed on an outer periphery of the protruding portion, and sealing a gap between the first surface and the protruding portion,
the entire sealing member is disposed inside the attachment hole, and
the ventilation structure satisfies at least one of the following conditions (I) and (II):
(I) the supporting portion is at least partially disposed inside the space surrounded by the first surface;
(II) the housing has a bottom portion disposed closer to the inner space of the housing than is the sealing member without being contact with the sealing member, the bottom portion protruding from the first surface toward an axis of the attachment hole.

2. The ventilation structure according to claim 1, wherein the supporting portion is at least partially disposed inside the space surrounded by the first surface.

3. The ventilation structure according to claim 1, wherein the first surface is positioned closer to the inner space of the housing adjacent to the attachment hole than an outer surface of the housing around the attachment hole is.

4. The ventilation structure according to claim 1, wherein the supporting portion has an outer diameter smaller than the hole diameter at an end of the attachment hole adjacent to the outer space of the housing.

5. The ventilation structure according to claim 1, wherein the housing has the bottom portion disposed closer to the inner space of the housing than is the sealing member, and the bottom portion protrudes from the first surface toward the axis of the attachment hole.

6. The ventilation structure according to claim 5, wherein the bottom portion is annular.

7. The ventilation structure according to claim 6, wherein
the supporting portion has an adherend surface to which the gas-permeable membrane is attached,
the attachment hole includes an opening surrounded by the bottom portion, and
the gas-permeable membrane overlaps the opening in a direction perpendicular to the axis of the attachment hole.

8. The ventilation structure according to claim 5, wherein
the supporting portion has an adherend surface to which the gas-permeable membrane is attached, the adherend surface facing in a direction being identical to a direction in which an outer surface of the bottom portion faces the sealing member.

9. The ventilation structure according to claim 1, wherein
the protruding portion has a flange protruding toward the first surface at a position closer to the inner space of the housing than the sealing member.

10. The ventilation structure according to claim 1, wherein
the protruding portion has an inverse tapered portion having an outer diameter increasing in a direction from the outer space of the housing toward the inner space of the housing.

11. The ventilation structure according to claim 1, wherein
the protruding portion has a locking portion locked to the housing.

12. The ventilation structure of claim 1, wherein
the ventilation component further comprises
a cap coupled to the supporting portion, the cap covering the gas-permeable membrane, and forming a space communicating with an outer space of the ventilation component between the cap and the gas-permeable membrane.

13. The ventilation structure according to claim 1, wherein
in a state where the ventilation component is detached from the housing, a cross section of the sealing member along a plane including an axis of the sealing member is a circle, an ellipse, or a plane having an angle.

14. A ventilation structure comprising:
a housing including an outward protruding portion protruding outward, the housing having an attachment hole formed in a top portion of the outward protruding portion; and
a ventilation component attached to the housing to close the attachment hole, and having a ventilation path between an inner space of the housing and an outer space of the housing, wherein
the ventilation component comprises:
a supporting portion being annular and surrounding the ventilation path in plan view;
a gas-permeable membrane closing the ventilation path in a ventilatable manner;
a protruding portion protruding from the supporting portion toward the inner space, and being inserted into the attachment hole to be in contact with the housing;
a lateral portion being annular and surrounding the outward protruding portion in plan view; and
a sealing member sealing a gap between a lateral surface of the outward protruding portion and the lateral portion; wherein
the lateral portion extends in a direction parallel to an axis of the attachment hole,
the outward protruding portion has a lateral surface extending in a direction parallel to the axis of the attachment hole,
the sealing member is compressively deformed in a direction perpendicular to the axis of the attachment hole by the lateral surface of the outward protruding portion and the lateral portion,
the sealing member is invisible when the ventilation structure is viewed along the direction perpendicular to the axis of the attachment hole, and
the ventilation structure satisfies at least one of the following conditions (i) and (ii),
(i) the lateral portion covers the sealing member,
(ii) the lateral portion has a laterally protruding portion protruding toward the outward protruding portion.

15. The ventilation structure according to claim 14, wherein
the ventilation structure further satisfies the following condition (iii),
(iii) the lateral portion is coupled to the supporting portion.

16. The ventilation structure according to claim 14, wherein
the lateral portion has a laterally protruding portion protruding toward the outward protruding portion, and
the laterally protruding portion is in contact with the sealing member.

17. The ventilation structure according to claim 14, wherein
the ventilation structure satisfies at least one of the following conditions (iv), (v), and (vi):
(iv) the protruding portion has a locking portion locked to the housing;
(v) the ventilation component further comprises a cap coupled to the supporting portion so that the cap covers the gas-permeable membrane and forms a space communicating with an outer space of the ventilation component between the cap and the gas-permeable membrane; and
(vi) in a state where the ventilation component is detached from the housing, a cross section of the sealing member along a plane including an axis of the sealing member is a circle, an ellipse, or a plane having an angle.

* * * * *